(12) United States Patent
Bartel et al.

(10) Patent No.: US 9,222,544 B2
(45) Date of Patent: Dec. 29, 2015

(54) DEVICE FOR MECHANICAL VIBRATION DECOUPLING

(75) Inventors: Torsten Bartel, Darnstadt (DE); Tobias Melz, Darmstadt (DE)

(73) Assignee: FRAUNHOFER-GESELLSCHAFT ZUR, Munich (DE)

( * ) Notice: Subject to any disclaimer, the term of this patent is extended or adjusted under 35 U.S.C. 154(b) by 61 days.

(21) Appl. No.: 14/008,026

(22) PCT Filed: Mar. 30, 2012

(86) PCT No.: PCT/EP2012/001442
§ 371 (c)(1),
(2), (4) Date: Sep. 27, 2013

(87) PCT Pub. No.: WO2012/130474
PCT Pub. Date: Oct. 4, 2012

(65) Prior Publication Data
US 2014/0027601 A1    Jan. 30, 2014

(30) Foreign Application Priority Data
Apr. 1, 2011    (DE) .......................... 10 2011 015 800

(51) Int. Cl.
| F16F 15/04 | (2006.01) |
| F16F 15/073 | (2006.01) |
| F16F 3/00 | (2006.01) |
| F16F 1/18 | (2006.01) |

(Continued)

(52) U.S. Cl.
CPC .............. *F16F 15/005* (2013.01); *F16F 15/007* (2013.01); *F16F 15/073* (2013.01); *F16M 13/02* (2013.01); *H01L 41/09* (2013.01); *H01L 41/1132* (2013.01); *H01L 41/1134* (2013.01); *F16F 15/021* (2013.01); *F16F 15/022* (2013.01)

(58) Field of Classification Search
CPC ....... F16F 15/02; F16F 15/021; F16F 15/022; F16F 15/005; F16F 15/007; F16F 15/073; H01L 41/09; H01L 41/1132; H01L 41/1134
USPC ......... 248/560, 618, 619, 638, 550, 605, 614; 267/158, 163, 136; 188/380
See application file for complete search history.

(56) References Cited

U.S. PATENT DOCUMENTS 2,932,482 A * 4/1960 Dickie .......................... 248/619
3,185,428 A   5/1965 Farabaugh, Jr. et al.

(Continued)

FOREIGN PATENT DOCUMENTS

AT    345042 B    8/1978
DE    690 32 856 T2    8/1990

(Continued)

*Primary Examiner* — Tan Le
(74) *Attorney, Agent, or Firm* — Fitch, Even, Tabin & Flannery, LLP

(57) ABSTRACT

A device is disclosed for mechanical vibration decoupling having two bearing ends to which bodies for reciprocally decoupling vibrations are joined which are interconnected by couplings having a variably adjustable stiffness. The couplings comprise at least three spring beam elements each having a spring beam surface from which a normal vector extends and which are each dimensionally stable in a longitudinal direction and are elastical orthogonal to the spring beam surface. The at least three spring beam elements are disposed spatially relative to each other so that normal vectors thereof are each orientated at an angle α relative to each other with α=90°±30°.

31 Claims, 2 Drawing Sheets

(51) Int. Cl.
*F16F 15/00* (2006.01)
*H01L 41/113* (2006.01)
*F16M 13/02* (2006.01)
*H01L 41/09* (2006.01)
*F16F 15/02* (2006.01)

(56) References Cited

U.S. PATENT DOCUMENTS

| | | | | |
|---|---|---|---|---|
| 5,029,398 A | * | 7/1991 | Ertl | 33/503 |
| 5,310,157 A | * | 5/1994 | Platus | 248/619 |
| 5,645,260 A | * | 7/1997 | Falangas | 248/550 |
| 2014/0014808 A1 | * | 1/2014 | Kaal et al. | 248/575 |

FOREIGN PATENT DOCUMENTS

| | | |
|---|---|---|
| DE | 10 2005 043 429 A1 | 11/2006 |
| EP | 1 927 782 A1 | 6/2008 |
| FR | 2 900 144 | 10/2007 |
| JP | 58 050337 A | 3/1983 |
| WO | WO 91/02921 | 3/1991 |

* cited by examiner

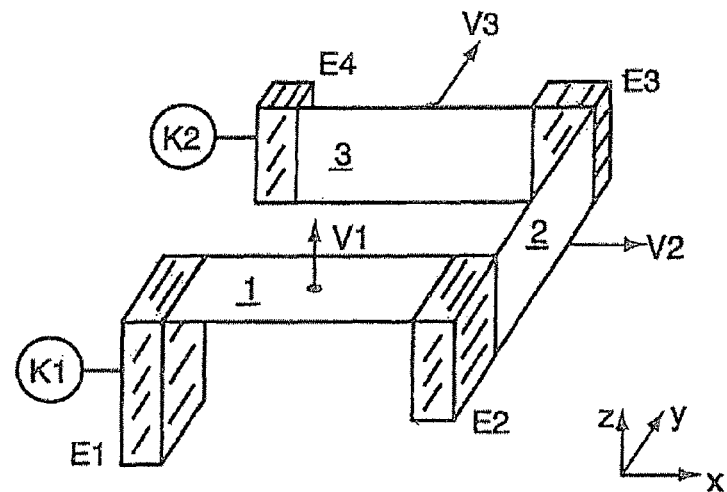
Fig. 1
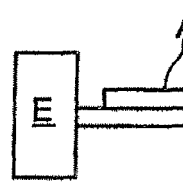 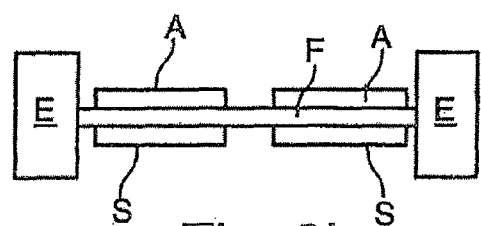
Fig. 2a  Fig. 2b
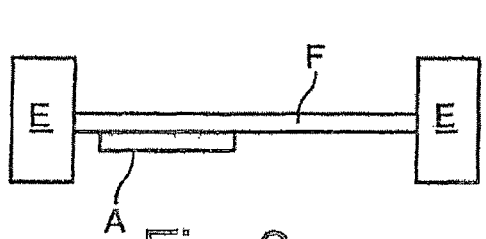 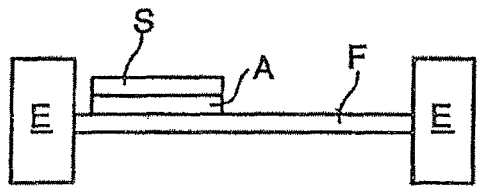
Fig. 2c  Fig. 2d

DEVICE FOR MECHANICAL VIBRATION DECOUPLING

CROSS REFERENCE TO RELATED APPLICATION

Reference is made to German Patent Application Serial No. DE 10 2011 015 800.6, filed on Apr. 1, 2011, which application is incorporated herein by reference in its entirety.

BACKGROUND OF THE INVENTION

1. Field of the Invention

The invention relates to a device for mechanical vibration decoupling with two bearing ends, onto which bodies for reciprocally decoupling vibrations can be joined or are joined and which are interconnected via a coupling structure with a variably adjustable stiffness.

2. Description of the Prior Art

If a body has to be borne with as little vibration as possible, for example for isolating a body against the vibrations predominating in the area surrounding the body, or to prevent the transmission of a stimulus from a vibrating body to the surrounding area, in a known manner a device for mechanical vibration decoupling, a bearing is used, which via a coupling structure has as little stiffness as possible. Passive bearings are devices for mechanical vibration decoupling, having a coupling structure which is predefined via an invariable stiffness, such as for example due to a spring or rubber element. The bearing stiffness of passive bearings has the particular disadvantage of excessive vibration on occurrence of the resonance frequency of the vibrating coupled system. Resonance maximum vibration amplitudes occur which lead to increased noise nuisance and considerable structural weakening of the bodies connected by the bearing. This disadvantage is countered by increasing the damping, whereby, however, the effect of vibration decoupling worsens at higher frequencies.

In contrast to this, active bearings provide a variation of the stiffness of the coupling structure arranged between the two bodies for decoupling vibrations. Active bearings usually have a coupling structure having a basic stiffness and a sensor for recording the current vibration status as well as an actuator influencing the stiffness of the coupling structure. As part of controlled force input provided by the actuator on the stiffness of the active bearing, the increase in vibration in the event of resonance can be reduced without permanently impairing the isolation effect at higher frequencies, as in the case of a passive bearing.

As an example of an active bearing, reference is made to U.S. Pat. No. 5,645,260 which discloses an active bearing unit for the isolating a payload relative to a vibrating substrate. The payload is fixed to the upper section of an S-shaped curved aluminium bracket which has a lower end securely fastened to the vibrating substrate. The aluminium bracket has both a horizontally and vertically orientated bracket section. Rat piezo actuators are applied along each bracket section. To dampen the vibration of the payload loaded by the aluminium bracket, a vibrating substrate is provided to which control signals are applied to horizontal and vertical flat piezo actuators through which the horizontal and vertical orientated bracket section experience corresponding dynamic stiffening for attenuating or completely preventing the transmission of vibration by the vibrating substrate to the payload.

DE 690 32 856 T2 describes a vibrating damping system providing for vibrations of very small amplitude being damped, particularly in a lower frequency range. In principle the vibration damping system comprises a vertical damping device and a horizontal damping device both with a stiffness of zero or almost zero. An essential part of the vertical damping device is a triple arm spring element, in the middle of which the load impinges. The stiffness of the spring elements is adjusted by force acting radially from outside on "arms" so that a net stiffness of almost zero is achieved. Load bearing devices are used to adjust the radial forces, which have two cantilever-like bending devices arranged between a middle section and two ends. The ends are firmly attached to the base by way of so-called spacer blocks.

EP 1 927 782 A1 discloses an active mass damper with a cantilever beam, which connects a mass damper with a fastening device. Arranged on at least one side of the cantilever beam is a piezoelectric actuator which bends the cantilever beam. This produces a force on the fastening structure which has a vibration damping effect.

DE 10 2005 043 429 A1 describes a device for vibration decoupling having a sensor-actuator unit for recording load-related vibration of a means and counteracts the vibration of the means. Sensors and/or actuators can comprise a transducing material, for example a piezoelectric material.

U.S. Pat. No. 3,185,428 describes a bearing allowing a translational movement in three spatial directions, but prevents rotation. The bearing comprises four parts that are moveable with regard to each other, namely a base and three frames nested one inside the other. The base is connected to any type of supporting structure. The load is arranged on the innermost frame. The frame can moved in all spatial directions, that is, in two horizontal directions and vertically without, however, being able to rotate about a vertical axis of rotation. The inner frames are each supported against the externally surrounding frame with a pair of leaf springs arranged on opposite frame sides, whereby the pair of leaf springs between the innermost and the second frame is offset by 90° with regard to the other pair of leaf springs. Each leaf spring is connected by one end to the frame on the inside and by the middle thereof to the frame on the outside. The outermost frame is connected to the basis via vertically arranged leaf springs.

AT 345 02 042 B discloses a spring set for the concentric, sprung guiding of oscillating moved components provided by spring elements which are aligned in parallel and are fixed against each other by spacing elements at their ends. The spring set comprises a pair of springs in parallel and a single spring perpendicularly thereto.

U.S. Pat. No. 2,932,482 discloses an arrangement having two pairs of leaf springs arranged orthogonally with regard to each other for allowing translational, but not rotational movement of two objects relative to each other.

SUMMARY OF THE INVENTION

The invention is a device for mechanical vibration decoupling having two bearing ends on which bodies are provided which reciprocally decoupling vibrations and which are interconnected via a coupling structure with a variably adjustable stiffness. The three-dimensional vibration decoupling between two bodies, which connects by means of the coupling structure, is made possible. The device required for this should be compact and, if possible, freely scalable. In addition, the costs of decoupling vibration by design and control technology should be minimized as far as possible.

In accordance with the invention, a device for mechanical vibration decoupling is provided having two bearing ends onto which bodies for reciprocally decoupling vibrations can or are joined which are interconnected via a coupling structure with a variably adjustable stiffness. The coupling structure has at least three spring beam elements to which the spring beam surface can be assigned which is characterized by a normal vector and which are each dimensionally stable in a longitudinal direction and elastic in a direction orthogonal to the spring beam surface. The at least three spring beam elements are also arranged spatially with respect to each other in such a way that their normal vectors form an angle α, whereby α=90°±30°, preferably α=90°. That is, the normal vectors are orthogonally orientated with regard to each other. The individual spring beam elements are each firmly damped at spring beam ends opposite each other to a damping device. A first and a second damp is connected to one of the two bearing ends and the second damp securely connects two spring beam elements to each other. The second damps are exclusively carried by the spring beam elements and are otherwise mounted in a freely oscillating manner.

A device for mechanical vibration decoupling in accordance with the invention allows the vibration-coupled and/or vibration-damped mounting of two bodies relative to each other about three spatial axes preferably oriented orthogonal in relation to each other. At least one separately formed spring beam element is arranged along an axis having a spring stiffness determined by its material, shape and size. Depending on the application, it is advantageous to produce the at least three spring beam elements individually. That is, each spring element should have a different spring stiffness. Through providing individual spring beam elements, it is possible to set up different and individually selected spring stiffnesses along the three preferably orientated orthogonal spatial directions.

The at least three spring beam elements are each firmly held by mechanical damping along their spring beam ends opposite the face end. In this way each individual spring beam element is mechanically restrained on both sides, as a result of which, at the point of clamping a system-related vibration node is formed. The clamps comprise a rigid, unyielding material that does not deform in spite of the forces and torques acting on the clamps via the spring beam elements. This guarantees that the mutual spatial position of two spring beam elements, which is interconnected via a clamp, remains constant.

In addition to the individual production of each spring beam element and the associated individual spring beam stiffness, it is particularly advantageous to provide a means for influencing the surface stiffness and/or damping along at least one spring beam element and preferably along all the spring beam elements. The means for influencing the stiffness and/or the damping orthogonally to the spring beam surface has at least one transducer material which is able to produce electrical energy through changing shape, or, through the application of electrical energy, is able to bring about geometric shape changes. Particularly suitable for this are flat piezoelectric actuators which are applied to the surface of the spring beam element or are integrated within the spring beam element. Actuators integrated in the spring element are manufactured from a surface composite material that has a sandwich structure. Usually the spring beam elements are made of metallic materials which preferably are spring steel.

In order to influence the stiffness of the spring beam element, the means must be controlled in dependence on the travel distance of the spring beam element in question. To influence damping, the means are controlled in terms of the speed with which the spring beam element is subjected to deformations in the form of vibrations.

For producing an adaptronic vibration decoupler which automatically adapts to the current vibration behavior, it is necessary to provide along at least one spring beam element a sensor recording the current vibration status as well as an actuator influencing the vibration status along the spring beam element. The sensor does not necessarily have to be provided along the spring beam elements, and it is also possible to apply the required sensors at the location of the bearing ends or even on the vibrating bodies which must be mounted relative to each other via a coupling structure.

A preferred embodiment has two spring beam elements which are arranged in parallel, are displaced at a distance from each other, and are damped between two damps. With a double arrangement of the spring beam elements extending between the two damps, the surface stiffness acting between the damps can be controlled, and large parallel displacements of the damps connected to each other by the spring beam elements is mechanically accomplished. Due to the use of a pair of spring beam elements between two damps, displacement trajectories resulting from rotational movement of components about the clamps are essentially eliminated.

The compact design of a device in accordance with the invention for mechanical vibration decoupling also makes possible combining individual devices in accordance with the invention to provide modular mechanical vibration decoupling to provide multi-axis active bearing units. In accordance with the modular principle, at least two devices in accordance with the invention, which provide vibration decoupling, are combined in series or in parallel. In the case of series coupling, the second bearing end of the first device is securely coupled to the first bearing end of the second device. In the case of parallel coupling, the first bearing ends and the second bearing ends of both devices are securely coupled to each other,

BRIEF DESCRIPTION OF THE DRAWINGS

The invention will be described below without restricting the invention using examples of embodiments and with reference to the drawings, whereby:

FIG. 1 shows a schematic view of a coupling structure with three leaf spring elements connected in series via clamps;

FIGS. 2a, b, c and d show possible arrangements of actuators/sensors on a spring beam element;

DETAILED DESCRIPTION OF THE INVENTION

Figure 3:
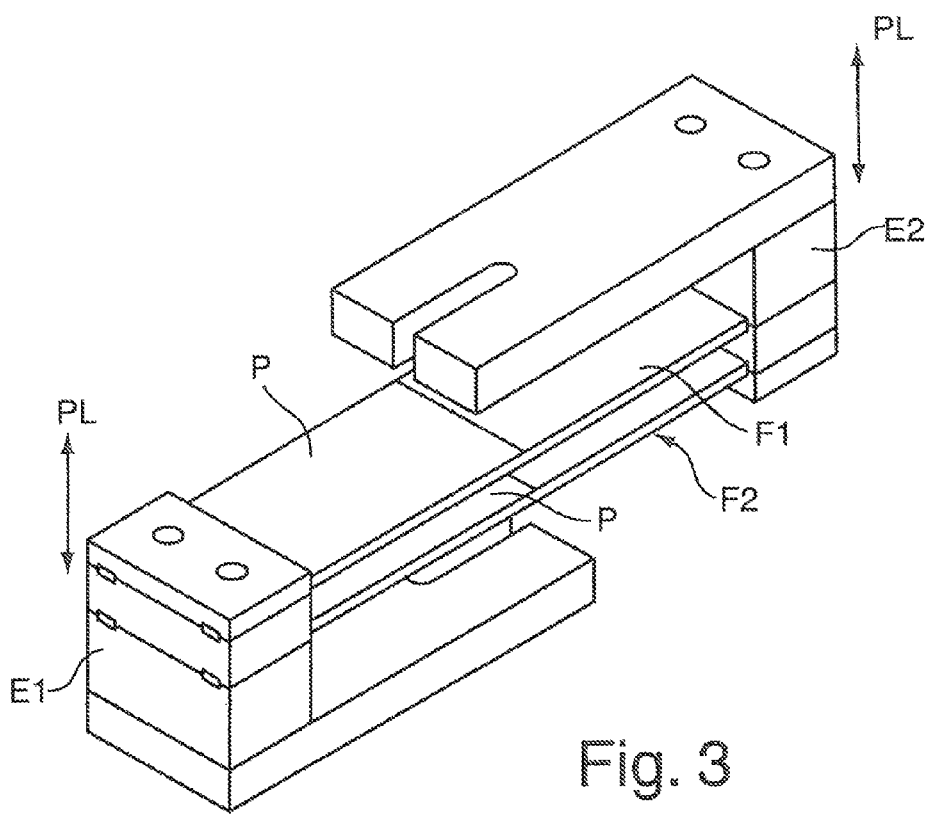
FIG. 3 illustrates two spring beam elements arranged in parallel between two clamps.

FIG. 1 shows a schematic view of a coupling structure in accordance with the invention providing vibration decoupling between two bodies K1 and K2. It is assumed that the clamp E1 is connected on one side with a body K1 and on the other side a spring beam element end of a first spring beam element 1 is securely attached. The spring beam element 1 is a surface element and typically has a rectangular spring beam surface having a surface normal vector V1 orientated in the z-direction as for the example shown in FIG. 1. In addition to the embodiment in FIG. 1, a Cartesian coordinate system with the spatial axes x, y and z is also illustrated. The spring element end of the spring beam element 1 opposite the clamp 1 is fastened to a clamp 2. Also securely attached to the clamp E2 is a spring beam element end of the spring beam element 2 having a spring beam surface orientated orthogonal to the spring beam surface of the spring beam element 1 and a surface normal vector V2 orientated in the x-direction. Furthermore, the spring beam element end of the spring beam element 2 opposite the clamp 2 is securely connected to clamp E3. In turn, the clamp 3 is connected to a spring beam element end of the third spring beam element 3 which finally is connected to clamp E4, on which the second body K2 is applied. The spring beam surface of the third spring beam element 3 has a surface normal vector V3 which is orientated in the y-direction and therefore is also orthogonal to the surface normal vectors V1 and V2.

From the schematic view in accordance with FIG. 1, it can be seen that the damps E2 and E3 are exclusively borne by the spring beam elements 1, 2 and 3 and are otherwise mounted in a freely oscillating manner.

The spring beam elements 1, 2 and 3 are not necessarily identical in terms of shape, size and material and differ depending on the application, in order to ultimately obtain different surface stiffnesses relative to the spatial direction determined by the spatial axes x, y and z.

Actuator A is provided for the autonomous variation of the surface stiffness of preferably each individual spring beam element to be implemented during decoupling of vibrations which preferably is on the surface of each spring beam element. Actuator A is a flat piezoelectric actuator constructed from a transducer material, which in response to electrical energy, changes shape so that the surface stiffness of the spring beam element in question can be influenced. In FIGS. 2a to d, different arrangements of actuators A and sensors S are illustrated along the surface of the spring beam element F. Longitudinal sections through a spring beam element F are securely damped on both sides between two damps E and E. FIG. 2a shows two piezoelectric actuators A applied to a different surface and FIG. 2b shows a combination of actuators A and sensors S which are applied alternately on the opposite upper sides of the spring beam element 1. FIG. 2c only shows a one-sided application of an actuator A on the lower side of a spring beam element F. FIG. 2d shows a sandwich structure of actuator A and sensor S in direct sequence on an upper side of the surface element F. With piezoelectric actuators applied on the surface or within the spring beam element F, direct influence of the surface stiffness of each individual spring beam element F is possible.

FIG. 3 shows the clamping of two parallel spring beam elements F1 and F2 between two clamps E1 and E2. Piezoelectric transducers are provided on the upper surfaces of both spring beam elements F1 and F2 for actively influencing the surface stiffness of spring beam element F1 and F2.

A parallel arrangement of two spring beam elements F1 and F2 between two clamping elements E1 and E2 restricts the relative movement of the two clamps relative to each other so that the clamps can only be displaced in parallel with each other. See movement arrows PL.

Figure 4:
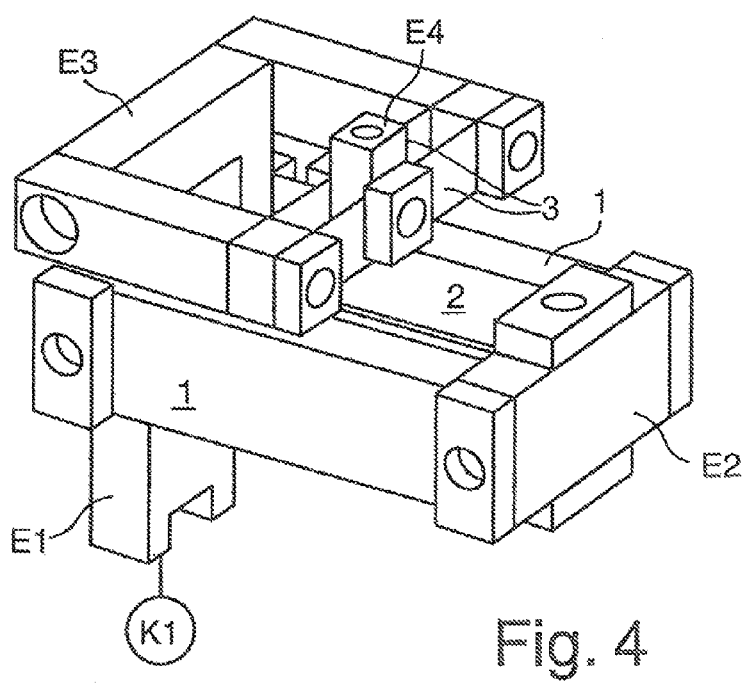
FIG. 4 shows a perspective view of a completed coupling structure.

The embodiment shown in FIG. 4 of a coupling structure has two spring beam elements guided in parallel between two clamps. By applying clamps E1 to the body K1, the leaf spring elements 1 are each guided in parallel and are securely clamped at the end face. The parallel spring beam elements 1 are securely connected to the clamps E2 on one side of the second spring beam element 2. The clamping of the spring beam element 2 at the rear on clamp E3, which is not illustrated, is separated from the first clamp E1 and has a U-shaped section disposed over the first and second spring beam elements. Third spring elements are applied between the section ends of the U-shaped section which are each centrally connected to the fourth clamp E4 to which the second body K2 can be securely connected.

FIG. 4 is a perspective view showing the surface orientation of the spring beam elements 1, 2 and 3, which in accordance with the invention, are disposed in a direction along normal vectors orientated orthogonal to each other.

It is to be noted that the spring beam elements 1, 2 and 3 are each connected to flat actuators to directly influence the surface stiffness of the individual spring beam elements.

Due to a compact design, it is also possible to modularly combine the device in accordance with the invention as modules in any way to provide series or parallel coupling with further devices for mechanical vibration decoupling which either are of identical design or differ in terms of shape and size.

The device in accordance with the invention can be used any where there is a requirement to provide a vibration-free bearing for a body or device relative to the surrounding. More particularly in the case of sensitive measuring and analysis devices, such as microscopes, active bearing of the measuring device is necessary. In the same way active bearings can be integrated into precision manufacturing installations such as in the integrated circuit industry.

LIST OF REFERENCES

E1 First clamp
E2 Second clamp
E3 Third clamp
E4 Fourth clamp
1 First spring beam element
2 Second spring beam element
3 Third spring beam element
A Actuator
S Sensor
K1, K2 Body
V1, V2 and V2 Normal vectors
E Clamp
F Spring beam element
PL Vibration direction
P Piezoelectric actuator

The invention claimed is:

1. A device for mechanical vibration decoupling including two bearing ends onto which bodies for reciprocally decoupling vibrations may be applied and which are interconnected with a variably adjustable stiffness, comprising:
   at least three spring beam elements each having a spring beam surface with a normal vector and which are each dimensionally stable in a longitudinal direction and each are elastic in a direction of the normal vector, and wherein
   the least three spring beam elements are disposed spatially with respect to each other so that the normal vectors form an angle $\alpha$ such that $\alpha = 90° \pm 30$;
   the spring beam elements each having two mutually opposite spring beam ends each secured by a clamp;
   first and fourth clamps which are each connected to a different bearing end;
   clamps, other than the first and fourth clamps, which connect two spring beam elements to each other; and
   the other clamps than the first and fourth clamps are only carried by the spring beam elements and are mounted to oscillate freely.

2. A device in accordance with claim 1, wherein:
   a device for influencing elasticity or stiffness is disposed along at least one spring beam in a direction orthogonal to the spring beam surface.

3. A device in accordance with claim 1, comprising:
   a device for influencing elasticity in the direction of the normal vector comprises a transducer material which produces electrical energy by changing shape.

4. A device in accordance with claim 1, comprising:
at least one actuator including transducer material and at least one sensor including transducer material which is either applied along at least one spring beam or integrated within the at least one spring beam.

5. A device in accordance with claim 2, comprising:
at least one actuator including transducer material and at least one sensor including transducer material which is either applied along at least one spring beam or integrated within the at least one spring beam.

6. A device in accordance with claim 3, comprising:
at least one actuator including transducer material and at least one sensor including transducer material which is either applied along at least one spring beam or integrated within the at least one spring beam.

7. A device in accordance with claim 4, wherein:
the at least one actuator and the sensor comprise a piezoelectric material.

8. A device in accordance with claim 5, wherein:
the at least one actuator and the sensor comprise a piezoelectric material.

9. A device in accordance with claim 6, wherein:
the at least one actuator and the sensor comprise a piezoelectric material.

10. A device in accordance with claim 1, wherein:
at least one first spring beam is clamped between two clamps to at least one second spring beam, which is spaced from and parallel to the at least one first spring beam element and is clamped between the two clamps.

11. A device in accordance with claim 2, wherein:
at least one first spring beam is clamped between two clamps to at least one second spring beam, which is spaced from and parallel to the at least one first spring beam element and is clamped between the two clamps.

12. A device in accordance with claim 3, wherein:
at least one first spring beam is clamped between two clamps to at least one second spring beam, which is spaced from and parallel to the at least one first spring beam element and is clamped between the two clamps.

13. A device in accordance with claim 7, wherein:
at least one first spring beam is clamped between two clamps to at least one second spring beam, which is spaced from and parallel to the at least one first spring beam element and is clamped between the two clamps.

14. A device in accordance with claim 1, comprising:
a first, second, third and fourth clamps with the first clamp connecting one bearing end to a first spring beam element; and wherein
the fourth clamp is connected to another bearing end and to a third spring beam element; and
the second clamp is connected to a first spring beam element and to a second spring beam element and a third clamp is connected to the second and to the third spring beam elements.

15. A device in accordance with claim 2, comprising:
a first, second, third and fourth clamps with the first clamp connecting one bearing end to a first spring beam element; and wherein
the fourth clamp is connected to another bearing end and to a third spring beam element; and
the second clamp is connected to a first spring beam element and to a second spring beam element and a third clamp is connected to the second and the to third spring beam elements.

16. A device in accordance with claim 4, comprising:
a first, second, third and fourth clamps with the first clamp connected to one bearing end and to a first spring beam element; and wherein
the fourth clamp connected to another bearing end and to a third spring beam element; and
the second clamp is connected to a first spring beam element and to a second spring beam element and a third clamp is connected to the second and to the third spring beam elements.

17. A device in accordance with claim 7, comprising:
a first, second, third and fourth clamps with the first clamp connected to one bearing end and to a first spring beam element; and wherein
the fourth clamp is connected to another bearing end and to a third spring beam element; and
the second clamp is connected to a first spring beam element and to a second spring beam element and a third clamp is connected to the second and to the third spring beam elements.

18. A device in accordance with claim 10, comprising:
a first, second, third and fourth clamps with the first clamp connected to one bearing end and to a first spring beam element; and wherein
the fourth clamp is connected to another bearing end and to a third spring beam element; and
the second clamp is connected to a first spring beam element and to a second spring beam element and a third clamp is connected to the second and to the third spring beam elements.

19. A device in accordance with claim 1, comprising:
at least one bearing end which is part of a vibrating body.

20. A device in accordance with claim 2, comprising:
at least one bearing end which is part of a vibrating body.

21. A device in accordance with claim 4, comprising:
at least one bearing end which is part of a vibrating body.

22. A device in accordance with claim 7, comprising:
at least one bearing end which is part of a vibrating body.

23. A device in accordance with claim 10, comprising:
at least one bearing end which is part of a vibrating body.

24. A device in accordance with claim 14, comprising:
at least one bearing end which is part of a vibrating body.

25. A device in accordance with claim 1, comprising:
at least two devices including a first and a second device, each device having a first and a second bearing end providing a series of couplings to the devices with the second bearing end of the first device being coupled to the bearing end of the second device, or
a parallel coupling of the devices with first bearing ends and second bearing ends of the devices being connected to each other.

26. A device in accordance with claim 4, comprising:
at least two devices including a first and a second device, each device having a first and a second bearing end providing a series couplings to the devices with the second bearing end of the first device being coupled to the bearing end of the second device, or
a parallel coupling of the devices with first bearing ends and second bearing ends of the devices being connected to each other.

27. A device in accordance with claim 10, comprising:
at least two devices including a first and a second device, each device having a first and a second bearing end providing a series couplings to the devices with the second bearing end of the first device being coupled to the bearing end of the second device, or a parallel coupling of the devices with first bearing ends and second bearing ends of the devices being securely connected to each other.

28. A device in accordance with claim 14, comprising:

at least two devices including a first and a second device, each device having a first and a second bearing end providing a series couplings to the devices with the second bearing end of the first device being coupled to the bearing end of the second device, or a parallel coupling of the devices with first bearing ends and second bearing ends of the devices being connected to each other.

29. A device in accordance with claim 1, comprising:

normal vectors of the at least three spring beam elements which are disposed in a direction orthogonal to each other.

30. A device in accordance with claim 1, comprising:

rigid clamps.

31. A device in accordance with claim 5, comprising:

two spring beam elements which are connected rigidly by a clamp defining an angle of 90°.

* * * * *